(12) United States Patent
Swann

(10) Patent No.: US 8,739,084 B2
(45) Date of Patent: May 27, 2014

(54) SYSTEMS AND METHODS FOR OPTIMIZING BOOLEAN LOGIC USING ORGANICALLY-GROWN KARNAUGH MAPS

(76) Inventor: Matthew James Swann, Auburn, AL (US)

( * ) Notice: Subject to any disclaimer, the term of this patent is extended or adjusted under 35 U.S.C. 154(b) by 121 days.

(21) Appl. No.: 13/550,130

(22) Filed: Jul. 16, 2012

(65) Prior Publication Data
US 2013/0019215 A1 Jan. 17, 2013

Related U.S. Application Data

(60) Provisional application No. 61/507,700, filed on Jul. 14, 2011.

(51) Int. Cl.
*G06F 17/50* (2006.01)

(52) U.S. Cl.
USPC ............ 716/101; 716/104; 716/106; 716/136

(58) Field of Classification Search
USPC .................. 716/100–106, 116–117, 132, 136
See application file for complete search history.

(56) References Cited

U.S. PATENT DOCUMENTS

| 5,805,462 A * | 9/1998 | Poirot et al. .................. 716/103 |
| 2010/0083201 A1* | 4/2010 | Moon ............................... 716/5 |

OTHER PUBLICATIONS

M. Karnaugh, The Map Method for Synthesis of Combinational Logic Circuits, Nov. 1953, pp. 953-599.
K.N. Plataniotis et al., A Karnaugh Map {2,2} Secret Sharing Scheme For Color Images, 2009.
A. Jakobschuk, Graphical Simplification of Switching Functions With More Than Four Variables, Sep. 22, 1969.
Alan B. Marcovitz et al., An Improved Algorithm for the Simplification of Switching Functions Using Unique Identifiers on a Karnaugh Map, Apr. 1969.
A. K. Halder, Karnaugh Map Extended to Six or More Variables, Sep. 30, 1982.
Edward T. Lee, An Expert System for Karnaugh Map Minimization, IECON'91, pp. 1517-1520.
A. Tran, Tri-state map for the minimisation of exclusive-OR switching functions, IEE Proceedings, Jan. 1989, pp. 16-20, vol. 136, Pt. E, No. I.
Gary W. Schwede, Fuzzy Maps, IEEE Transactions on Systems, Man, and Cybernetics, Sep. 1977, pp. 669-674, vol. SMC-7, No. 9.
Theodore M. Booth, The Vertex-Frame Method for Obtaining Minimal Proposition-Letter Formulas, IRE Transactions on Electronic Computers, Apr. 1962, pp. 144-154.
Michel E. Holder, A Modified Karnaugh Map Technique, IEEE Transactions on Education, Feb. 2005, pp. 206-207, vol. 48, No. 1.

* cited by examiner

*Primary Examiner* — Paul Dinh
(74) *Attorney, Agent, or Firm* — Carter, DeLuca, Farrell & Schmidt, LLP

(57) ABSTRACT

Systems and methods for optimizing Boolean logic are provided. The systems generate a one-dimensional array having a plurality of values corresponding to a plurality of indices, and determine a first location of a Karnaugh map in a first dimension thereof. The first location is determined using a first value of the one-dimensional array corresponding to a first index of the one-dimensional array. The systems also determine a second location of the Karnaugh map in a second dimension thereof. The second location is determined using a second value of the one-dimensional array corresponding to a second index of the one-dimensional array. The systems evaluate a target location within the Karnaugh map corresponding to the first and second indices in the first and second dimensions of the Karnaugh map, respectively, and search for at least one of a simplified minterm and a simplified implicant having the target location using the one-dimensional array.

26 Claims, 12 Drawing Sheets

|     | A,B  206 | 208 | 210 | 212 |  ← 202 |
|-----|------|-----|-----|-----|
| C   | 00   | 01  | 11  | 10  |
| 0   | 0<br>000 | 2<br>010<br>B | 6<br>110<br>AB | 4<br>100<br>A |
| 1   | 1<br>001<br>C | 3<br>011<br>BC | 7<br>111<br>ABC | 5<br>101<br>AC |

FIG. 2D

|      | A  214 |         | ← 204 |
|------|--------|---------|
| B,C  | 0      | 1       |
| 00   | 0<br>000 | 4<br>100<br>A |
| 01   | 1<br>001<br>C | 5<br>101<br>AC |
| 11   | 3<br>011<br>BC | 7<br>111<br>ABC |
| 10   | 2<br>010<br>B | 6<br>110<br>AB |

FIG. 2E

| 0 | 1 | 3 | 2 | 6 | 7 | 5 | 4 |
|---|---|---|---|---|---|---|---|
|   | +1 | +2 | -1 | +4 | +1 | -2 | -1 |
|   | $+2^0$ | $+2^1$ | $-2^0$ | $+2^2$ | $+2^0$ | $-2^1$ | $-2^0$ |

| 0<br>00000 | 4<br>00100<br>C | 12<br>01100<br>BC | 8<br>01000<br>B | 24<br>11000<br>AB | 28<br>11100<br>ABC | 20<br>10100<br>AC | 16<br>10000<br>A |
|---|---|---|---|---|---|---|---|
| 1<br>00001<br>E | 5<br>00101<br>CE | 13<br>01101<br>BCE | 9<br>01001<br>BE | 25<br>11001<br>ABE | 29<br>11101<br>ABCE | 21<br>10101<br>ACE | 17<br>10001<br>AE |
| 3<br>00011<br>DE | 7<br>00111<br>CDE | 15<br>0111<br>BCDE | 11<br>01011<br>BDE | 27<br>11011<br>ABDE | 31<br>11111<br>ABCDE | 23<br>10111<br>ACDE | 19<br>1001<br>ADE |
| 2<br>00010<br>D | 6<br>00110<br>CD | 14<br>0110<br>BCD | 10<br>01010<br>BD | 26<br>11010<br>ABD | 30<br>11110<br>ABCD | 22<br>10110<br>ACD | 18<br>10010<br>AD |

| 0<br>000000 | 8<br>001000<br>C | 24<br>011000<br>BC | 16<br>010000<br>B | 48<br>110000<br>AB | 56<br>111000<br>ABC | 40<br>101000<br>AC | 32<br>100000<br>A |
|---|---|---|---|---|---|---|---|
| 1<br>000001<br>F | 9<br>001001<br>CF | 25<br>011001<br>BCF | 17<br>010001<br>BF | 49<br>110001<br>ABF | 57<br>111001<br>ABCF | 41<br>101001<br>ACF | 33<br>100001<br>AF |
| 3<br>000011<br>EF | 11<br>001011<br>CEF | 27<br>011011<br>BCEF | 19<br>010011<br>BEF | 51<br>110011<br>ABEF | 59<br>111011<br>ABCEF | 43<br>101011<br>ACEF | 35<br>100011<br>AEF |
| 2<br>000010<br>E | 10<br>001010<br>CE | 26<br>011010<br>BCE | 18<br>010010<br>BE | 50<br>110010<br>ABE | 58<br>111010<br>ABCE | 42<br>101010<br>ACE | 34<br>100010<br>AE |
| 6<br>000110<br>DE | 14<br>001110<br>CDE | 30<br>011110<br>BCDE | 22<br>010110<br>BDE | 54<br>110110<br>ABDE | 62<br>111110<br>ABCDE | 46<br>101110<br>ACDE | 38<br>100110<br>ADE |
| 7<br>000111<br>DEF | 15<br>001111<br>CDEF | 31<br>011111<br>BCDEF | 23<br>010111<br>BDEF | 55<br>110111<br>ABDEF | 63<br>111111<br>ABCDEF | 47<br>101111<br>ACDFE | 39<br>100111<br>ADEF |
| 5<br>000101<br>DF | 13<br>001101<br>CDF | 29<br>011101<br>BCDF | 21<br>010101<br>BDF | 57<br>110101<br>ABDF | 61<br>111101<br>ABCDF | 45<br>101101<br>ACDF | 37<br>100101<br>ADF |
| 4<br>000100<br>D | 12<br>001100<br>CD | 28<br>011100<br>BCD | 20<br>010100<br>BD | 54<br>110100<br>ABD | 60<br>111100<br>ABCD | 44<br>101100<br>ACD | 36<br>100100<br>AD |

FIG. 5

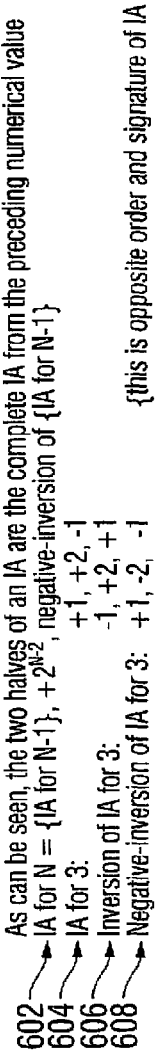

Rise and fall around the powers of two in connection with the incremental array (IA):
As can be seen, the two halves of an IA are the complete IA from the preceding numerical value
602 → IA for N = {{IA for N-1}, $+2^{N-2}$, negative-inversion of {IA for N-1}}
604 → IA for 3: $+1, +2, -1$
606 → Inversion of IA for 3: $-1, +2, +1$
608 → Negative-inversion of IA for 3: $+1, -2, -1$  {this is opposite order and signature of IA for 3}

610 { So, IA for 4 = {{IA for 3}, $+2^{4-2}$, negative inversion of {IA for 3}}
$+2^{4-2} = +2^2 = +4$
IA for 4 = {+1,+2,-1}, +4, {+1,-2,-1}

3 variable IA:
+1, +2, -1
$+2^0, +2^1, -2^0$

Decimal:
Power of 2:

Zero power: $+2^0$ ___ $-2^0$ ___
First power: ___ $+2^1$ ___

4 variable IA:
+1, +2, -1, +4, +1, -2, -1
$+2^0, +2^1, -2^0, +2^2, +2^0, -2^1, -2^0$ Zero power: $+2^0$ ___ $-2^0$ ___ $+2^0$ ___ $-2^0$
First power: ___ $+2^1$ ___ ___ ___ $-2^1$ ___
Second power: ___ ___ ___ $+2^2$ ___ ___ ___

5 variable IA:
+1, +2, -1, +4, +1, +2, -1, +8, +1, +2, -1, -4, +1, -2, -1
$+2^0, +2^1, -2^0, +2^2, +2^0, +2^1, -2^0, +2^3, +2^0, +2^1, -2^0, -2^2, +2^0, -2^1, -2^0$ Zero power: $+2^0$ ___ $-2^0$ ___ $+2^0$ ___ $-2^0$ ___ $+2^0$ ___ $-2^0$ ___ $+2^0$ ___ $-2^0$
First power: ___ $+2^1$ ___ ___ ___ $+2^1$ ___ ___ ___ $+2^1$ ___ ___ ___ $-2^1$ ___
Second power: ___ ___ ___ $+2^2$ ___ ___ ___ ___ ___ ___ ___ $-2^2$ ___ ___ ___
Third power: ___ ___ ___ ___ ___ ___ ___ $+2^3$ ___ ___ ___ ___ ___ ___ ___

612 {
6 variable IA:
+1, +2, -1, +4, +1, +2, -1, +8, +1, +2, -1, +4, +1, +2, -1, +16, +1, +2, -1, +4, +1, +2, -1, +8, +1, +2, -1, -4, +1, +2, -1, +8, +1, +2, -1, -4, +1, -2, -1
$+2^0,+2^1,-2^0,+2^2,+2^0,+2^1,-2^0,+2^3,+2^0,+2^1,-2^0,+2^2,+2^0,+2^1,-2^0,+2^4,+2^0,+2^1,-2^0,+2^2,+2^0,+2^1,-2^0,+2^3,+2^0,+2^1,-2^0,-2^2,+2^0,+2^1,-2^0,+2^3,+2^0,+2^1,-2^0,-2^2,+2^0,-2^1,-2^0$ Decimal:
Power of 2:

Zero power: $+2^0$ ___ $-2^0$ ___ $+2^0$ ___ $-2^0$ ___ $+2^0$ ___ $-2^0$ ___ $+2^0$ ___ $-2^0$ ___ $+2^0$ ___ $-2^0$ ___ $+2^0$ ___ $-2^0$ ___ $+2^0$ ___ $-2^0$ ___ $+2^0$ ___ $-2^0$
First power: ___ $+2^1$ ___ ___ ___ $+2^1$ ___ ___ ___ $+2^1$ ___ ___ ___ $+2^1$ ___ ___ ___ $+2^1$ ___ ___ ___ $+2^1$ ___ ___ ___ $+2^1$ ___ ___ ___ $-2^1$ ___
Second power: ___ ___ ___ $+2^2$ ___ ___ ___ ___ ___ ___ ___ $+2^2$ ___ ___ ___ ___ ___ ___ ___ $+2^2$ ___ ___ ___ ___ ___ ___ ___ $-2^2$ ___ ___ ___ ___ ___ ___ ___ $-2^2$
Third power: ___ ___ ___ ___ ___ ___ ___ $+2^3$ ___ ___ ___ ___ ___ ___ ___ ___ ___ ___ ___ ___ ___ ___ ___ $+2^3$ ___ ___ ___ ___ ___ ___ ___ $+2^3$
Fourth power: ___ ___ ___ ___ ___ ___ ___ ___ ___ ___ ___ ___ ___ ___ ___ $+2^4$

FIG. 6

SYSTEMS AND METHODS FOR OPTIMIZING BOOLEAN LOGIC USING ORGANICALLY-GROWN KARNAUGH MAPS

CROSS REFERENCE TO RELATED APPLICATIONS

This application claims the benefit of and priority to U.S. Provisional Application No. 61/507,700, which was filed on Jul. 14, 2011, the entirety of which is incorporated herein by reference.

BACKGROUND

1. Technical Field

The present disclosure relates to optimizing Boolean logic. More particularly, the present disclosure relates to systems and methods for optimizing Boolean logic using organically-grown Karnaugh maps. The optimized Boolean logic is used to optimize digital circuits, design or program programmable logic devices, in cryptography, in formal logic analysis, and in software-based CAD programs or teaching programs.

2. Description of Related Art

Boolean algebra is useful for designing digital circuits because function variables map well to the discrete states of digital circuits. For example, the "true" and "false" values of Boolean variables are easily mapped to the digital circuit states of "1" and "0," respectively. Additionally, Boolean algebra is useful in digital circuit design because digital circuits typically employ logic gates, including but not limited to, AND, NOT, NOR, and XOR. Well-known Boolean operators may represent these logic gates. For example, an AND gate is a circuit that physically operates as the logical conjunction operator of Boolean algebra. By using Boolean operators to represent these logic gates, Boolean algebra can be used to design, represent, and implement digital circuitry using function variables to represent the given status (or state) of a digital circuit.

Typically, the design of digital circuits begins by defining a set of desired output values to be produced by a set of input values. These output values can be conditioned upon previous input values or may be independent therefrom. Boolean variables are used to represent the input and output values. A Boolean expression is a function generated using Boolean variables and Boolean operators that completely represents the desired behavior of the digital circuit.

Once the Boolean expression is determined to characterize the digital circuit, the expression itself is converted to logic gates. These logic gates comprise several transistors using various well-known semiconductor design techniques, e.g., using photomasking techniques to implement the digital circuits using Complementary metal-oxide-semiconductor ("CMOS") logic, Transistor-transistor logic ("TTL"), etc. However, redundancies within the semiconductor device may exist if care is not taken to ensure their preclusion. Specifically, the Boolean expression may have repeating terms and/or may unnecessarily require inputs that can safety be ignored without affecting the desired response of the digital circuit. Expressions containing repeating terms and/or unnecessary inputs lead to inefficiencies and increase the power consumption of the digital circuit.

Various software tools manipulate Boolean expressions to aid in the design of digital circuits. These software tools help optimize Boolean expressions which reduces the number of logic gates needed (e.g., less area of a semiconductor substrate is needed when used to implement the digital circuit), increases efficiency, and reduces the digital circuit's power consumption by reducing the number of digital logic elements needed to implement the digital circuit. These software tools employ various algorithms and techniques to facilitate manipulation of Boolean expressions by reducing the number input variables within the expression, by eliminating non-consequential input parameters. That is, Boolean variables typically have several minterms or implicants. These software tools identify minterms or implicants that can be combined to reduce the number of input variables needed. For example, a Karnaugh map (referred to herein as "K-map") is used to optimize Boolean expressions by searching for minterms or maxterms that may be combined.

Additionally, Boolean expressions can be used in various other applications. For example, Boolean expressions may be used to design and program programmable logic devices, in cytological techniques, in formal logic analysis, and in software-based CAD programs or teaching programs.

SUMMARY

In aspects, the present disclosure features systems and corresponding methods for optimizing Boolean logic. The systems include a processor and a non-transitory, computer-readable medium in communication with the processor. The computer-readable medium comprises one or more programming instructions for generating a one-dimensional array having a plurality of values corresponding to a plurality of indices, and determining a first location of a Karnaugh map in a first dimension thereof. The first location corresponds to a first index of the one-dimensional array and to a target location of the Karnaugh map. The first location is determined using a first value of the one-dimensional array corresponding to the first index of the one-dimensional array.

The one or more programming instructions also include instructions for determining a second location of the Karnaugh map in a second dimension thereof. The second location corresponds to a second index of the one-dimensional array and to the target location of the Karnaugh map. The second location is determined using a second value of the one-dimensional array corresponding to the second index of the one-dimensional array. The one or more programming instructions further include evaluating the target location within the Karnaugh map corresponding to the first and second indices of the one-dimensional array in the first and second dimensions of the Karnaugh map, respectively, and searching for at least one of a simplified minterm and a simplified implicant having the target location using the one-dimensional array.

BRIEF DESCRIPTION OF THE DRAWINGS

These and other advantages will become more apparent from the following detailed description of the various embodiments of the present disclosure with reference to the drawings wherein:

FIGS. 2A-2E show several Karnaugh maps to related to the generation of the one-dimensional array shown in FIG. 1 in accordance with an embodiment of the present disclosure;

FIG. 2F shows various forms of a one-dimensional array used to generate a Karnaugh map in accordance with an embodiment of the present disclosure;

FIG. 4 shows a five-variable K-map that includes decimal value, binary representation and variable representation for each location within the Karnaugh map according to an embodiment of the present disclosure;

FIG. 5 shows a six-variable K-map that includes decimal value, binary representation and variable representation for each location within the Karnaugh map according to an embodiment of the present disclosure;

FIG. 6 illustrates the algorithm used to generate a one-dimensional array which in turn is used in the construction of a Karnaugh map according to an embodiment of the present disclosure.

DETAILED DESCRIPTION

Particular embodiments of the present disclosure are described herein below with reference to the accompanying drawings. In the following description, well-known functions or constructions may not be described in unnecessary detail to avoid obscuring the present disclosure. It is also to be understood that the disclosure in this specification includes combinations of parts, features, or aspects disclosed herein, and that various combinations of parts, features, or aspects may be combined, modified, or rearranged as appropriate. For example, where a particular feature is disclosed in the context of a particular aspect or embodiment of the present disclosure, or a particular claim, that feature can also be used, to the extent possible, in combination with and/or in the context of other particular aspects and embodiments of the present disclosure, and in the disclosure generally.

Figure 1:
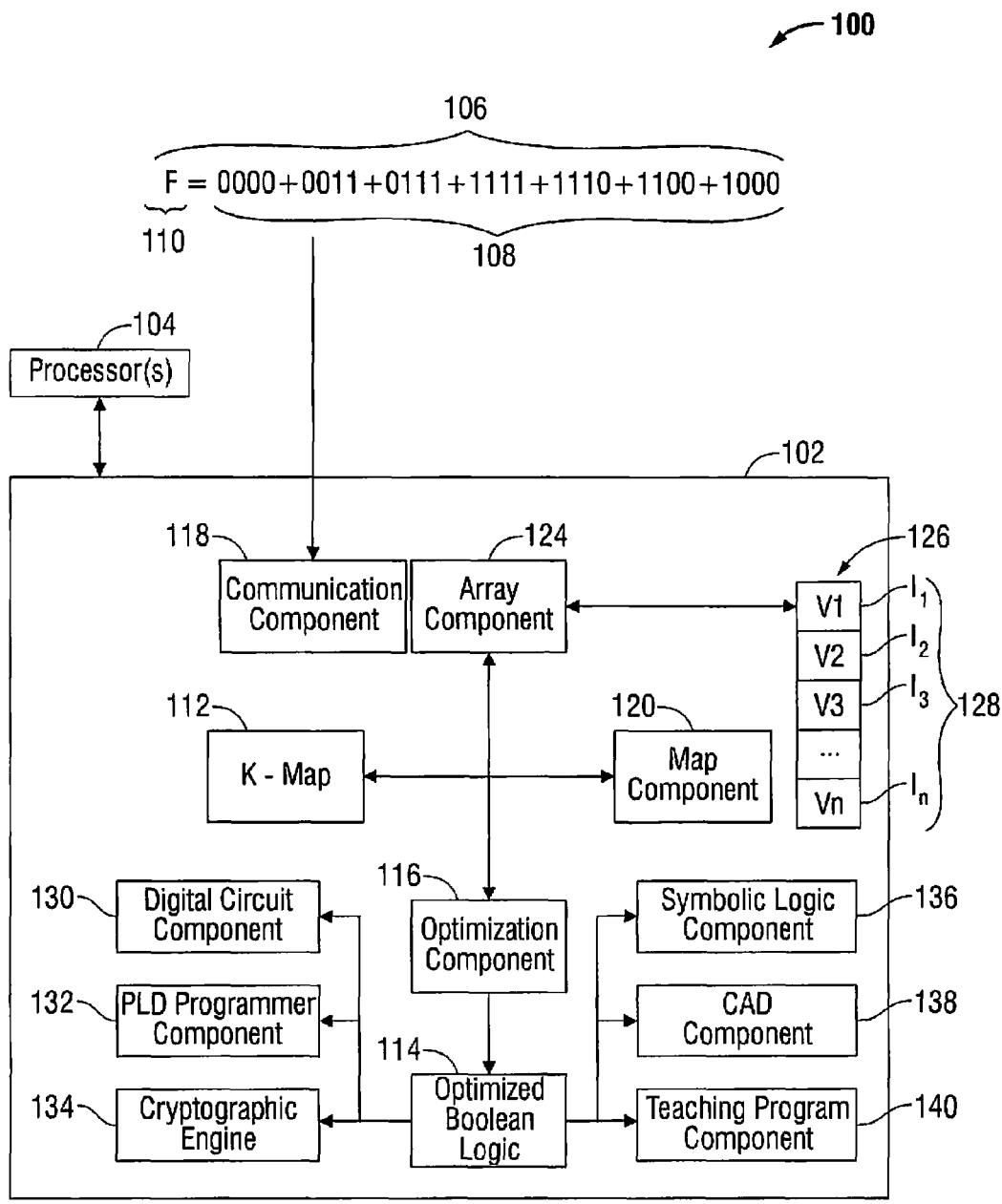
FIG. 1 shows a block diagram of a system for optimizing Boolean logic in accordance with an embodiment of the present disclosure.

FIG. 1 shows a block diagram of a system 100 for optimizing Boolean logic in accordance with an embodiment of the present disclosure. System 100 includes a non-transitory computer-readable medium 102 and a processor 104. The computer-readable readable medium 102 includes one or more programming instructions for execution on the processor 104. The system 100 may be part of the computer system shown in FIG. 7 as described below.

The system 100 receives one or more Boolean expressions 106 having minterms 108 defining a Boolean output variable 110. The minterms 108 correspond to Boolean input variables. For example, the minterm "0011" of minterms 108 is a input value corresponding to Boolean input variables "A," "B," "C," and "D" when "A" is set to "0," when "B" is set to "0," when "C" is set to "1," and when "D" is set to "1." The Boolean output variable 110 may be a digital logic output. The Boolean result "F" is a Boolean output variable 110 that has an output value of "1" or "0" depending upon the input values of "A," "B," "C," and "D." The selection of minterms 108 can characterize a desired response of a digital circuit. Additionally or alternatively, the system 100 receives a truth table, digital input/output pairs, or other digital logic or Boolean algebra representations.

The Boolean output variable 110 and the minterms 108 are mapped onto is the K-map 112. The mapping of the Boolean output variable 110 and minterms 108 onto the K-map 112 may occur simultaneously or contemporaneously with the generation of the K-map 112. The system 100 searches within the K-map 112 for simplified minterms and simplified implicants. The locations within the K-map 112 maintain a Hamming distance of one to facilitate the locating of any simplified minterms and simplified maxterms. After finding one or more simplified minterms or implicants within the K-map 112, an optimization component 116 generates optimized Boolean logic 114. The optimized Boolean logic 114 may be a data structure representing a digital circuit, programming instructions for a programmable logic device, symbolic logic, and the like. Additionally or alternatively, the K-map 112 may be used in cryptography, in educational software, in symbolic logic (e.g., evaluating various symbolic logic expressions), etc.

The optimized Boolean logic 114 may be used in several applications. For example, the optimized Boolean logic 114 may be used by components 130-140. A digital circuit component 130 can generate a digital circuit using the optimized Boolean logic 114, e.g., by generating a photomask. A PLD programmer component 132 can program a Programmable Logic Device using the optimized Boolean logic 114. A cryptographic engine 134 can use the optimized Boolean Logic 114 for encryption or decryption. A symbolic logic component 136 can use the optimized Boolean logic 114 to generate symbolic logic. A CAD component 138 can use the optimized Boolean logic in circuit CAD software. Additionally, the teaching program component 140 can use the optimized Boolean Logic 114 to demonstrate the optimization of Boolean logic.

The system 100 includes a communication component 118 that receives Boolean expression 106. The map component 120 uses the minterms 108 to determine first and second subsets of the Boolean input variables used by the minterms 108. The first subset is used to generate a first dimension of the K-map 112 by representing all of the Boolean variables of the first subset of the Boolean input variables of the minterms 108 within the first dimension of the K-map 112. That is, the number of Boolean input variables in the first subset determines the length of the first dimension of the K-map 112 by in accordance with Formula 1 as follows:

$$2^{\text{(number of Boolean variables in the first subset)}} \quad (1).$$

Likewise, the second subset is used to generate a second dimension of the K-map 112 by representing all of the Boolean variables of the second subset of the Boolean input variables used by the minterms 108 within the second dimension of the K-map 112. The number of Booleans variables in the second subset determines the length of the second dimension of the K-map 112 in accordance with Formula 2 as follows:

$$2^{\text{(number of Boolean variables in the second subset)}} \quad (2).$$

The array component 124 generates a one-dimensional array 126 having a plurality of values V1, V2, V3, ..., Vn. Each value may be indexed by a plurality of indices 128 including I1, I2, I3, ..., In. For example, index I2 corresponds to value V2. As described below, the one-dimensional array 126 is used to evaluate locations within the K-map 112 and corresponds to the first and second dimensions of the K-map 112.

The K-map 112 can be generated as needed. For example, in some embodiments, the K-map 112 is represented within Random Access Memory ("RAM"). As previously mentioned, the optimization component 116 searches within the K-map 112 for any simplified minterms or implicants therewithin. The optimization component 116 uses the one-dimensional array 126 to evaluate various locations within the K-map 112 with reference to the minterms 108. The optimization component can use the Quine-McCluskey algorithm to remove a duplicative variable from an input function of minterms. The Quine-McCluskey algorithm is well known to one of ordinary skill in the art. The generation and evaluation of the K-map 112 using the one-dimensional array 126 will now be described with reference to FIGS. 2A-E.

Figure 2A:
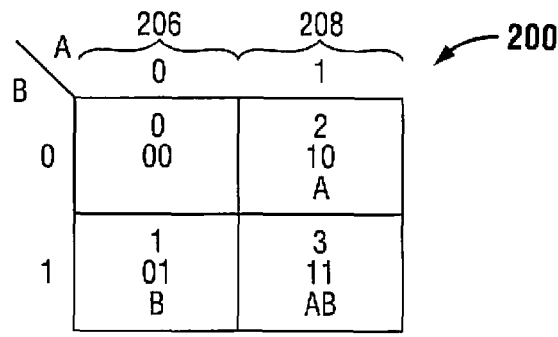
Figure 2B:
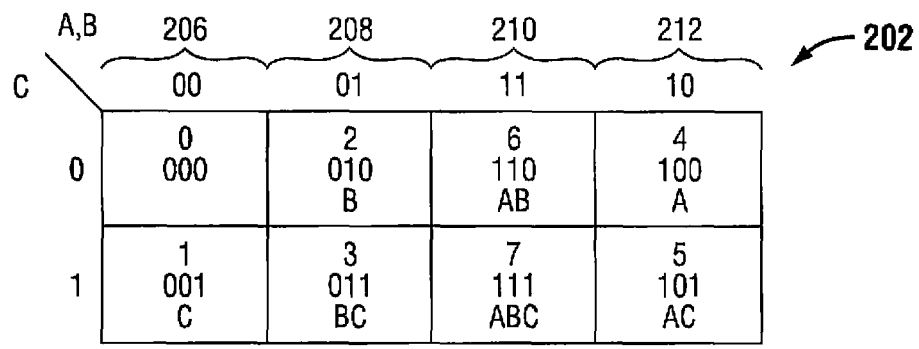
Figure 2C:
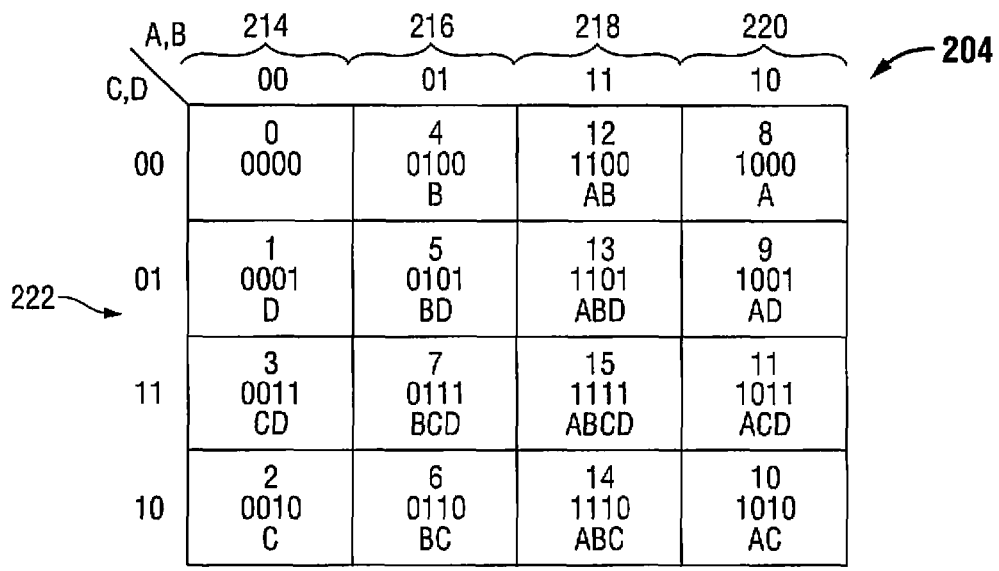

FIG. 2A shows a K-map 200 having two Boolean input variables (i.e., a two Boolean input variable Karnaugh Map); FIG. 2B shows a K-map 202 having three Boolean input variables; and FIG. 2C shows a K-map 204 having four Boolean input variables. FIGS. 2A-2E show several K-maps to illustrate generation of the one-dimensional array of the system of FIG. 1 in accordance with an embodiment of the present disclosure. The output Boolean variables are not show in FIGS. 2A-2E.

A pattern of expansion from the two-variable K-map 200 to the three-variable K-map 202 in conjunction with the pattern of expansion from the three-variable K-map 202 to the four-variable K-map 204 will now be described. This expansion pattern is extendible to infinitely sized K-maps (not shown). However, the growth of the K-map 112 does not behave in the same way when expanding from an even to an odd number of Boolean input variables. Nonetheless, the expansion from three to four variables within a K-map matches that of the growth from ninety-nine to one-hundred Boolean input variables.

The initial consideration as to the expansion of the K-map begins with an exploration regarding the general behavior of a K-map containing n Boolean input variables and a K-map containing n+1 Boolean input variables. As seen in the expansion from the two-variable K-map 200 to the three-variable K-map 202, a grid of equal size is placed adjacently to the original grid. That is, the two-variable K-map 200 includes columns 206 and 208, and K-map 202 includes new columns 210-212 and the columns 206 and 208. The indexing of the new locations within columns 206 and 208 begins from the outside of the appended section in the upper-most square, i.e., the location "4" within the K-map 202. The location 4 is across from the location 0 and was the original starting point for indexing the two-variable K-map 200. The two locations are directly reflective of one another across the meridian separating the original grid (see FIG. 2A) defined by columns 206 and 208 from the expanded section defined by columns 210 and 212. The location 5, being the second location to be indexed in the expanded section of the K-map 202, follows the lead of its reflective counterpart, location 1 as the second location to be indexed in the original grid. Therefore, location 5 is placed under location 4, in the position in the right corner of the K-map 202 and directly mirrored from location 1. The column 210 of the expanded section contains the only two remaining locations. Location 6 appears next to location 2 as the reflection across the meridian and is shortened due to the location being closer to the mirroring line. Finally, location 7 appears adjacent to the location 3, as both were the terminal indices placed within their respective portions of the K-map 202.

The expansion from a three to four-variable K-map, or any K-map with an odd number of variables to a K-map with one additional variable, occurs slightly differently. Even-to-odd expansion simply requires a reflection of the existing grid, which is a square. K-maps existing with odd variables are constructed by appending a grid of equal proportion thereto. Doubling the length of a grid and subsequently doubling the width of the product would yield a K-map four times the size of the original. However, the second mirroring does not preserve a global Hamming Distance of one between all adjacent squares.

As shown in FIGS. 2B-2C, which depicts the three-variable K-map 202 and the four-variable K-map 204, the four columns originally contained in the three-variable K-map 202 are effectively condensed into columns 214 and 216 in the four-variable K-map 204. That is, all of the locations within the three-variable K-map 202 are rearranged within the new columns 214 and 216 of the four-variable K-map 204. The left columns 214 and 216 of the four-variable K-map 204 only contain the entirety of locations from the three-variable K-map 202. Columns 208 and 210 of the three-variable K-map 202 are inverted and pulled under the columns 214 and 216 of the K-map 204 (as illustrated in FIGS. 2D and 2E). The four-variable K-map 204 is then reflected to its right and the expanded values are indexed according to the incremental placement of the indices on the original section of the K-map 204. For instance, the top-right square, i.e., location 8, of the K-map is the first square to be indexed. That is, the top-right square is given the location 8 as the number eight is the value 0 (from the exact mirrored square) plus the total number of locations on the original portion of the K-map 204. The location 9 is assigned its number and is positioned under location 8 and in a reflective position from 1 as it is the second number to be assigned in the expanded section, i.e., columns 218 and 220. The value 11 is placed under the location 9 as it is in the mirroring position of location 3; 11 is also the number of original squares plus the value of 3. The value 15 is placed to the left of the location 11 and to the right of the location 7.

The value of a location of any square on a K-map is a sum of the respective column and row headings. For example, location 1 of row 222 and the location 8 of column 220 may be added to find an intersection of 9, which is also the summation of locations 8 and 1. This summation property is a global property of K-maps in general including K-maps 200, 202, and 204. This property exists regardless of the size of the K-map due to the recursive mirroring that can be used to create a K-map of n variables, which inherently prevents against duplicity anywhere within the K-map.

As seen above, those values placed in the expanded locations of the K-map when adding Boolean input variables are equal to the value of their exact reflection plus the total number of squares in the original portion of the previous K-map (i.e., a K-map with one less Boolean input variable). Also observed is the mirrored placement of values of the locations on the expanded section. These two points begin to allow for an infinitely expandable K-map given that an n variable K-map can be constructed so long as the n−1 variable grid has been created.

FIGS. 3A-3D show a flow chart diagram 300 of a method for optimizing Boolean logic in accordance with an embodiment of the present disclosure. Method 300 includes steps 302-342.

Step 302 receives input values such that each of the input values corresponds to one or more Boolean input variables. The input values of Step 302 may be minterms 108 of FIG. 1 that represent that conditions that are "true." Step 304 receives output values such that the output values corresponds to one or more Boolean output values and each input value is mapped to a respective output value. The output values of Step 304 may be the Boolean output variable 110 of FIG. 1, e.g., the output value of Step 304 may be the value of "true" or "false" as found in a K-map discussed here. The mapped input and output values may be represented by the Boolean expression 106 of FIG. 1. Steps 302 and 304 may be performed by the communication component 118 of FIG. 1 to receive the Boolean expression 106.

Steps 306-312 determine the two dimensions of the K-map 112 of FIG. 1. Step 306 divides the total number of Boolean input variables by two. Step 308 rounds the results if necessary. That is, if the division of the total number of input variables produces a non-integer number, the result is rounded up or down. Step 310 determines a first subset of Boolean input variables to represent the first dimension of a Karnaugh map, e.g., K-map 112 of FIG. 1. The first dimension may be the row of K-map 112 of FIG. 1. The results of steps 308 and 310 may determine the number of Boolean input variables selected for use with the first dimension of the K-map 112. For example, the first of the Boolean input variables used by the minterms 108 are selected for use with the first subset until enough Boolean input variables are selected such that the number selected are the same as the number of the results of step 308. For example, if the total number of Boolean input variables used by the minterms 108 is 9, then step 306 has a result of 9/2, which is 4.5. Step 308 rounds 4.5 up to 5; and step 310 takes the first five Boolean input variables used by the minterms 108 to represent the first subset of the Boolean input variables used by the minterms 108. Therefore, the first five Boolean input variables represent the first dimension of the K-map 112. Step 312 determines a second subset of Boolean input variables to represent the second dimension of the Karnaugh map, e.g., K-map 112. Step 312 may use the remainder of the Boolean input variables used by the minterms 108 not used in the first subset of the Boolean input variables 108. The second dimension may be the columns of a Karnaugh map, e.g., K-map 112.

The number of columns of the K-map 112 is then calculated by raising two to the power of the number of Boolean input variables of the first subset. The number of columns of the K-map 112 is calculated by raising two to the power of the number of Boolean input variables of the second subset. This identity ensures that each unique permutation of binary data of n bits will have a reserved location.

Step 314 generates the one-dimensional array 126 having a plurality of values corresponding to the plurality of indices 128 (see FIG. 1). The following will describe the generation and derivation of the one-dimensional array of step 314, e.g., the one-dimensional array 126 of FIG. 1.

FIG. 2C shows Karnaugh's four-variable K-map 204 having the left-most column from top to bottom having the locations of 0, 1, 3, and 2. The differential between 0 and 1 is +1; between 1 and 3 is +2; and between 3 and 2 is −1. Due to the prior discussion as to row-column summation, one can properly conclude that this array can be applied to any particular column heading in order to produce each square value in the event that we did not know the row headings for a four-variable K-map 204. Starting with the column headed by the value 12: adding +1 yields 13; adding +2 yields 15; and adding −1 yields 14. The pattern is applicable for all of the K-map 204 and is confirmed by the four-variable K-map 204. The top-most row of the four-variable K-map 204 reads 0, 4, 12, and 8. This column increment pattern is simply 4 times the row increment pattern for a four-variable K-map 204. However, the "4" is not a hard and fast multiplier. That is, it is the dynamic result of the number of permutations contained within a single column of the greater grid. For example, an 8×8 grid of six variables, would have an incremental array of length 8 and a column heading multiplier of 8 as well. The length of the incremental array (i.e., one dimensional array) is subject to the longer of the two dimensions. In the given structures, the row length is the determining factor as to incremental array length as column depth is always less than or equal to that of the row length.

Referring to FIG. 4, a five-variable K-map 400 is shown having the column heading 402 pattern increments in the following way in terms of multiples of four: +1, +2, −1, +4, +1, −2, and −1. The five-variable K-map 400, however, has a row-heading pattern that increments in the same way as the four-variable K-map 204 of FIG. 2C. This is due to the four row by eight column structure of the K-map 400, and the expansion properties of even-to-odd K-map construction described earlier.

The one-dimensional array 126 of FIG. 1 mandates the values of the squares within the K-map 112. That is, the one-dimensional array 126 of FIG. 1 can be used to determine the values of any row or column within any K-map. The cumulative effect of the one-dimensional array 126, beginning with the top left corner of a K-map, guides value assignment throughout the K-map.

The one-dimensional array 126 contains a length equal to the number of columns of the K-map 112 minus one. As the one-dimensional array 126 contains the cumulative increments by which values will be assigned to the K-map 112, an array length equal to the number of columns provides a complete index representing the wrap-around increment between the right-most column and the left-most column. Though the inclusion of this value is not inappropriate, it is both frivolous and complicating in array construction. Values within the one-dimensional array 126 are assigned in a fashion similar to the way a binary search would be implemented. Positive or negative assignment occurs once the base values are established. Above, the five/six-variable one-dimensional array 126 included the values of: +1, +2, −1, +4, +1, −2, and −1 (see FIG. 2F). The seven values within the one-dimensional array 126 are indeed the number of columns minus one, or two to the third power minus one. The pattern is directed by a rise and fall of the powers of two. The one-dimensional array 126 values can be rewritten as: $+2^0, +2^1, -2^0, +2^2, +2^0, -2^1$ and $-2^0$ as shown in FIG. 2F.

As shown in FIG. 5, the largest value of the one-dimensional array 126 of FIG. 1 used to generate a K-map 500 is one less power of two than the power used to define the length of the one-dimensional array 126 itself. In this case, two is raised to the third power and one is subtracted to give a length of seven. One less power would be the second power of two. This second power of two is assigned to the middle of the array, which is in this case, is the fourth index.

Once the middle value is assigned, the power to which two is raised is decremented again; when the current power is two and the succeeding power is one. All indices not already assigned a value but are otherwise divisible by the current power of two, are assigned that power of two. Here the second, fourth, and sixth index locations are all divisible by $2^1$; however, the fourth index has already been assigned the value $2^2$. Therefore, the second and sixth indices are assigned $2^1$, while the fourth index remains unchanged. On larger K-maps, the process of subtracting one from the current exponent of two and filling only the empty index locations divisible by that power would continue until the exponent reached zero. At that point, the remaining indices are simply filled in with $2^0$.

At this point, the sign of each value has to be determined. The initial occurrence of a given value is always positive. And as can be seen from the above arrays, the sign of each value is the opposite of the sign of the same value that came before it. Ignoring all values aside from 1, the five/six-variable one-dimensional array 126 includes: +1, X, −1, X, +1, X, and −1. The same is true for the value 2, e.g., X, +2, X, X, X, −2, and X. Each occurring value has a sign that is opposite the sign of the previous same value regardless of the values dispersed intermittently. Another approach uses a negative inversion of subarrays wrapped around the increasing powers of two. For instance, the first power of two occurs at index location two, which is +2. The −1 occurring after the +2, is the negative of +1. The second power of two, occurring at index four, has +1, +2, and −1 as the values before it. The values of +1, +2, and −1 can be negated to become −1, −2, and +1. An inversion in regards to the order of the values yields +1, −2, −1. This product is indeed the later segment of the greater array.

FIG. 6 illustrates the generation of the one-dimensional array 126. The one-dimensional array 126 is also referred to as the incremental array ("IA"). The one-dimensional array for N is defined by the formula in line 602 of N=[{IA for N−1, +2^N−2, negative inversion of {IA for N−1}]. N is the number of variable to be mapped. That is, N is the number of Boolean inputs values to be mapped. Line 604 shows the one-dimensional array for 3 Boolean variables. Line 306 shows the inversion for the one-dimensional array for 3 Boolean variables. Line 608 shows the negative inversion of the one-dimensional array for 3 Boolean variables. Line 610 illustrates the one-dimensional array for 4 Boolean variables. Line 612 illustrates the generation of the one-dimensional array for 3 Boolean variables, 4 Boolean variables, 5 Boolean variables, and 6 Boolean variables. Note the recursive nature as shown in 602, in that the incremental array (i.e., the one-dimensional array 126 of FIG. 1) is generated by generating an array of one less value than the value of 2^N−2, and then finally the negative-inversion of the incremental array for the incremental array of one less value.

Refer to FIG. 5 for a description regarding how the one-dimensional array 126 of FIG. 1 is used to generate the rows and columns of a K-map. FIG. 5 shows the K-map 500. The K-map 500 must be framed and the one-dimensional array constructed. The one-dimensional array is processed to determine the row headings using summation. The column values are derived using a product of the current one-dimensional array value multiplied by the total number of rows. Next, the K-map is filled. This can be done in decimal or binary. Each square is filled with the arithmetic product of the respective row and column headings. The binary representation can also be found by appending k bits to j bits. k is the natural log of the number of rows, and j is the natural log of the number of columns. For instance, in the six-variable K-map, the square in the column designated 111000 and the row designated 000101 has a binary value of 111101.

As shown in the row heading of any of these K-maps, there is a one-dimensional K-map of n/2 rounded down variables. The four variable K-map 204 and the five-variable K-map 400 (see FIGS. 2C and 4) both have a left column that contains a two-variable K-map in one dimension, i.e., a one-dimensional array. As the K-map approaches an infinite number of variables, the one-dimensional map existing in the left most column approaches a variable count that equals infinity divided by two. The filling of the K-map tracks the incremental value as directed by the one-dimensional array. The value of the current square is equal to the previous square plus the positive or negative value that is within the current index of the one-dimensional array. The sole exception is the initial index within the map itself, which is always 0.

The one-dimensional array 126 is dynamically constructed. Tracking variables may be used, e.g., incremental values, the number of 1's, 2's, 4's, etc. The significant data from the evaluation of each binary representation may be stored in a string format. However, an algorithm using tracking variables may include the following: dynamically create the one-dimensional array, create a tracking variable, add the next value within the one-dimensional array, and evaluate the value. The arithmetics and analysis can continue until the necessary permutations have been exhausted. The algorithm may then return the string data for analysis.

Figure 3A:
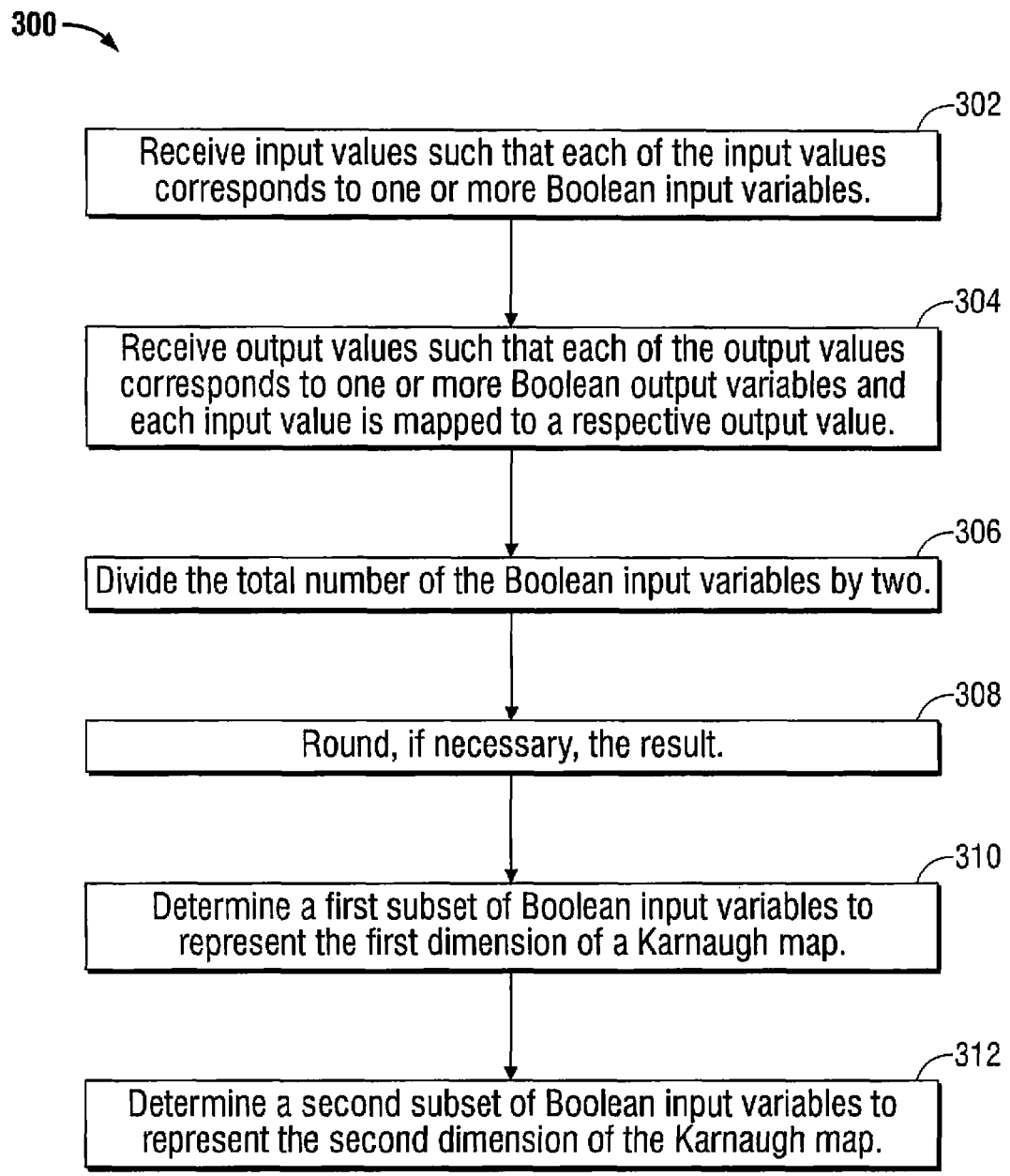
FIGS. 3A-3D show a flow chart diagram of a method for optimizing Boolean logic in accordance with an embodiment of the present disclosure.
Figure 3B:
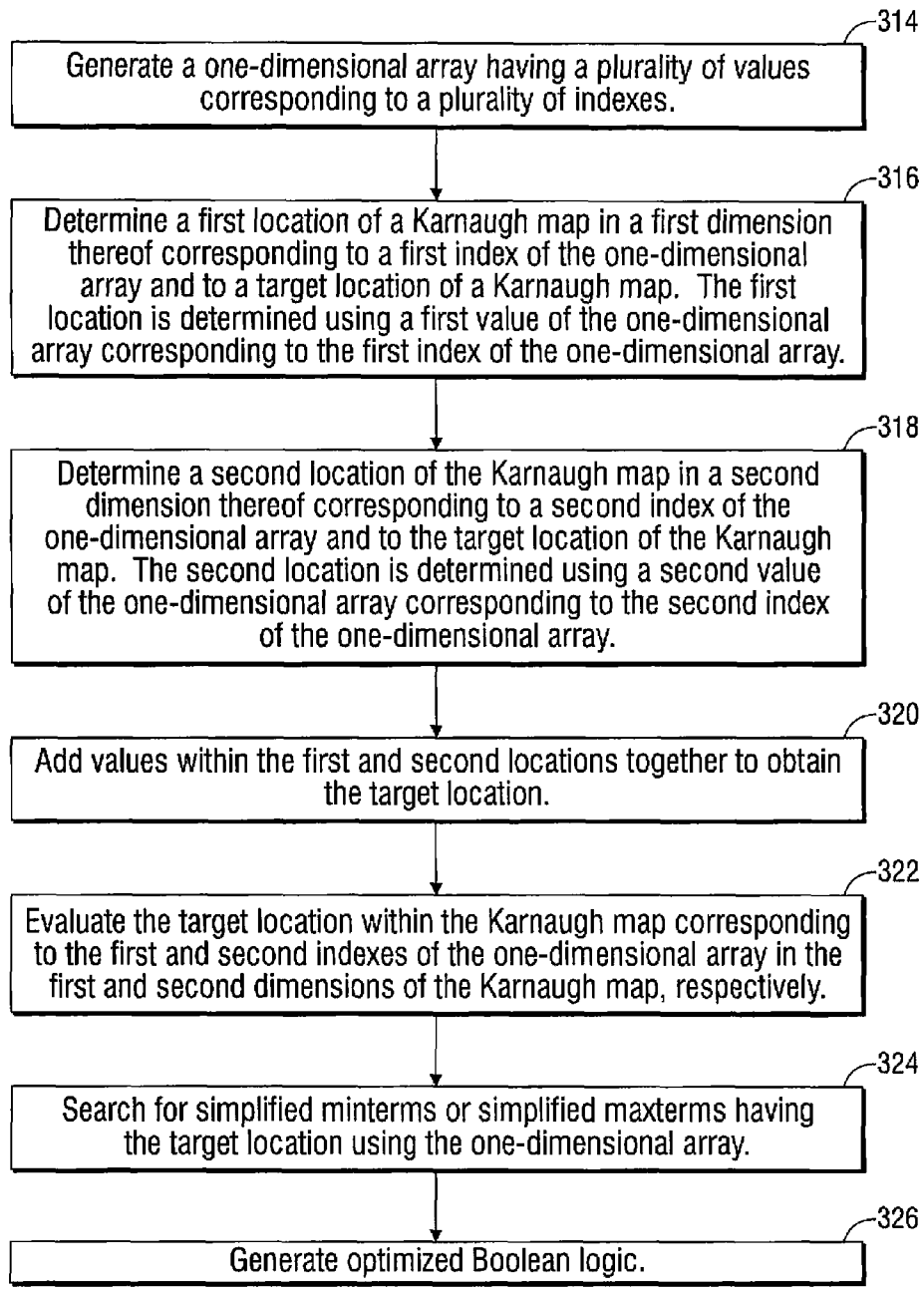
Figure 3C:
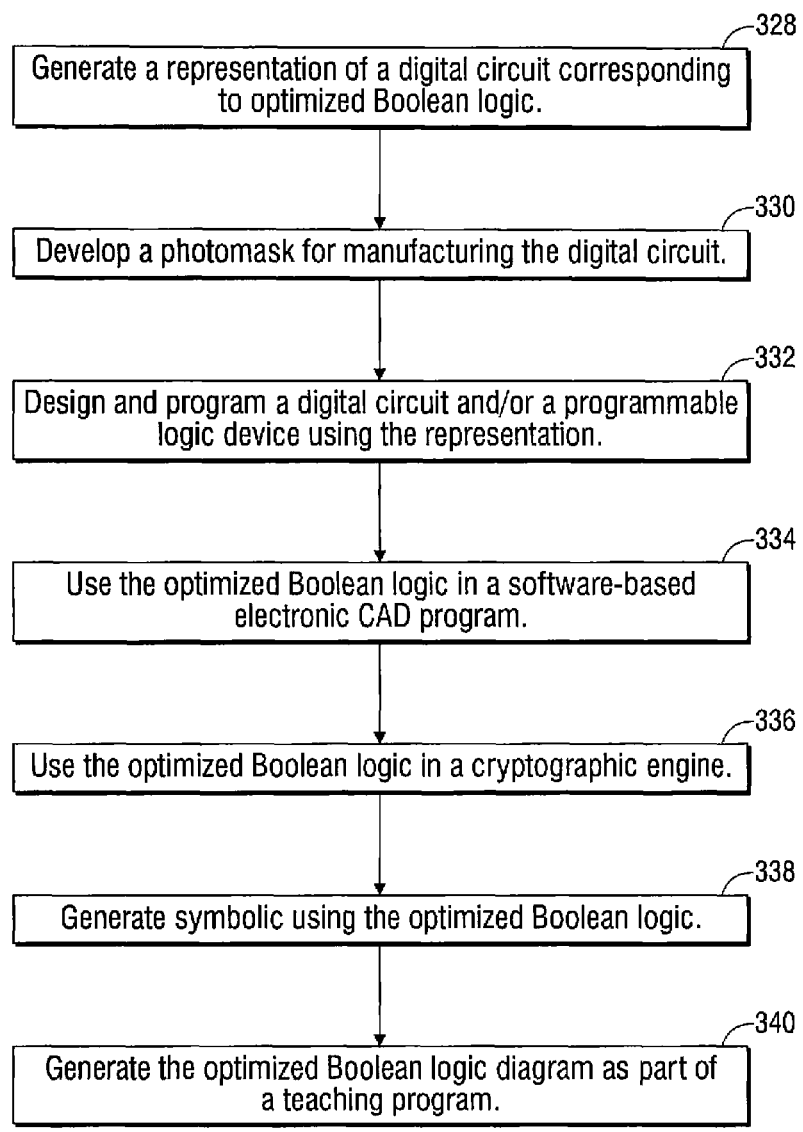
Figure 3D:
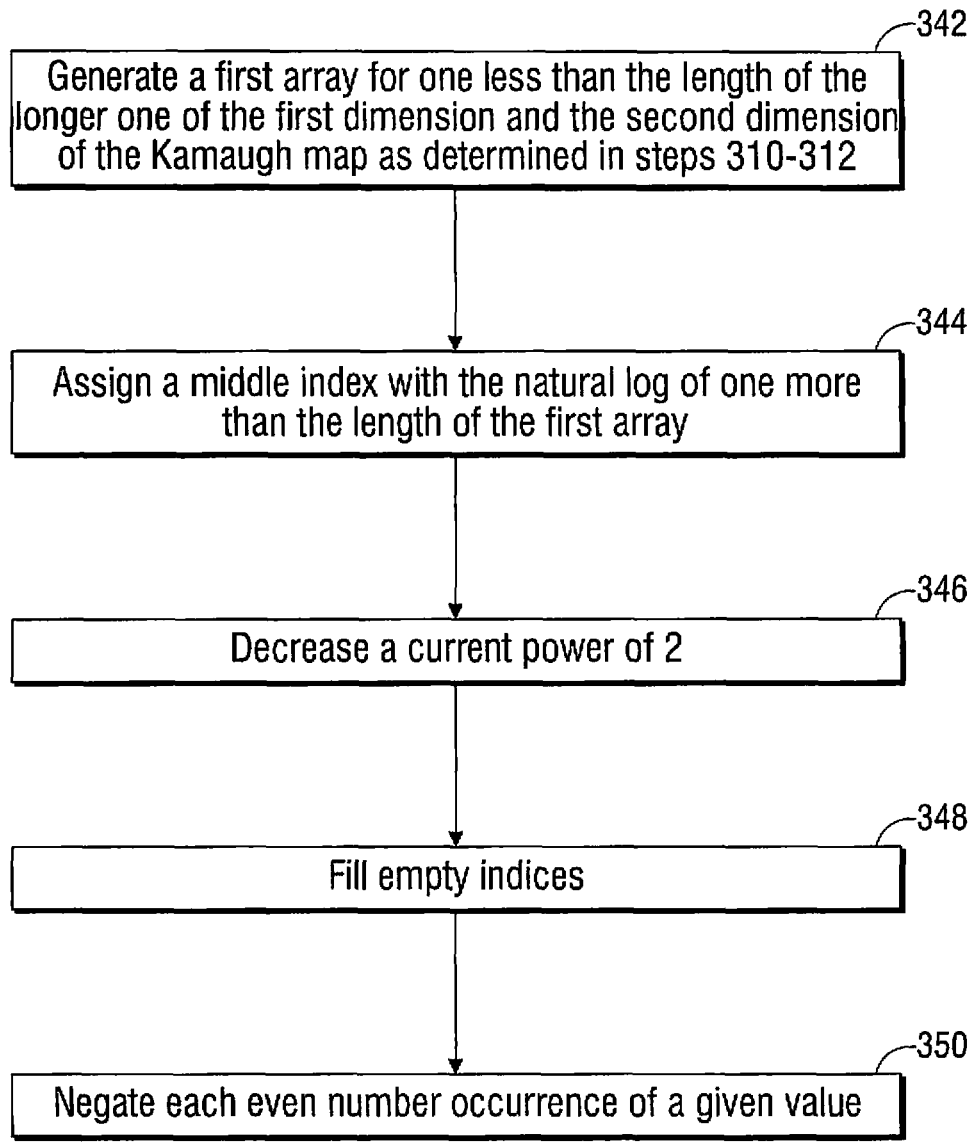

Referring now to FIG. 3D which shows the steps 344-350 for generating a one-dimensional array, e.g., the one-dimensional array 126 of FIG. 1. Also, refer to line 602 of FIG. 6. Step 342 generates a first array for one less than the length of the longer one of the first dimension and the second dimension of the Karnaugh map as determined in steps 342-350. Step 344 assigns a middle index with the natural log of one more than the length of the first array. Step 346 decreases a current power of 2. Step 348 fills empty indices. Step 350 negates each even number occurrence of a given value.

Additionally, the analysis of a dynamically generated one-dimensional map of a nearly unlimited number of variables may use tracking data as the one-dimensional array and may be dynamically constructed while the computer simultaneously analyzes the function in question. Memory usage of such an implementation includes the location for arithmetic calculation, variable tracking, and the upkeep of whatever information is being sought from the function. The map itself does not necessarily have to exist as a whole entity or as a string of basic arithmetics.

Referring again to FIGS. 3A-3D, method 300 generates a one-dimensional array having a plurality of values corresponding to a plurality of indices during step 314 as previously described. Step 316 determines a first location of a Karnaugh map in a first dimension thereof corresponding to a first index of the one-dimensional array and to a target location of the Karnaugh map. The first location is determined using a first value of the one-dimensional array corresponding to the first index of the one-dimensional array. Step 318 determines a second location of the Karnaugh map in a second dimension thereof corresponding to a second index of the one-dimensional array and to the target location of the Karnaugh map. The second location is determined using a second value of the one-dimensional array corresponding to the second index of the one-dimensional array.

Figure 3E:
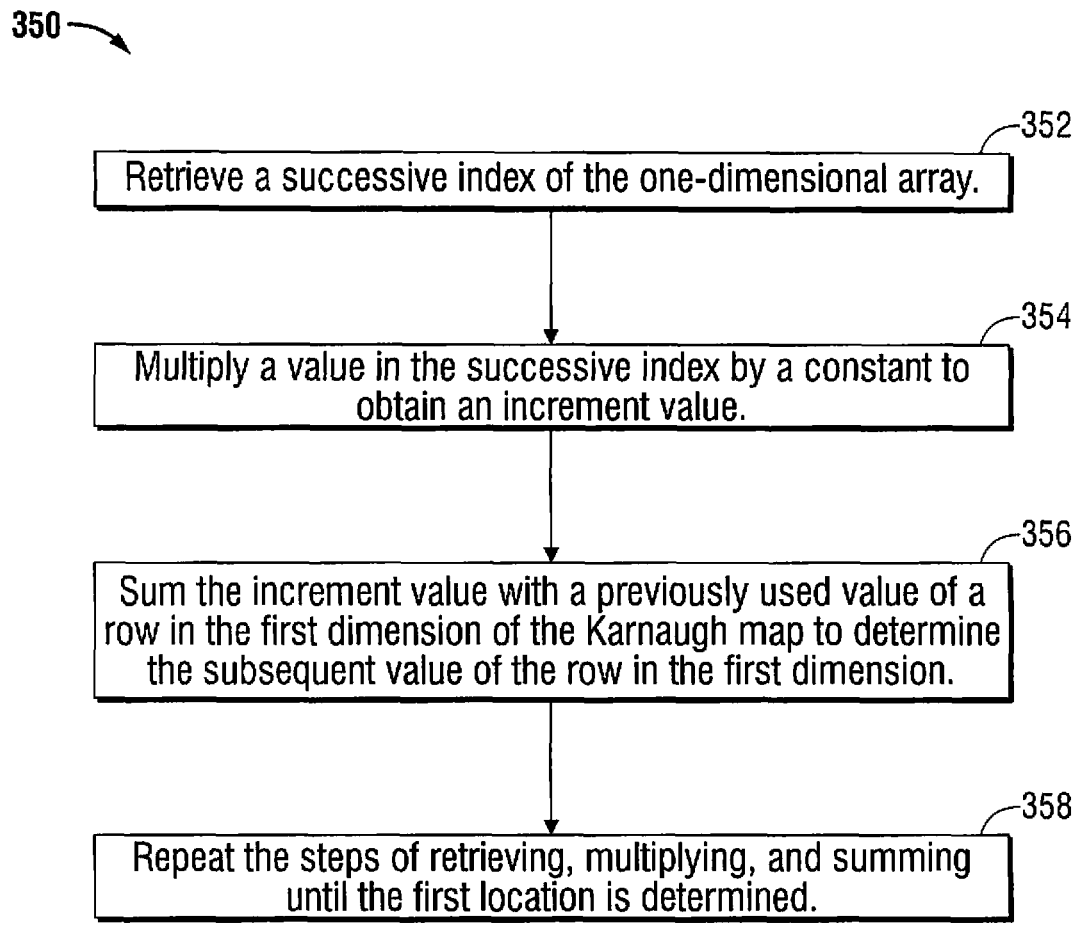
FIG. 3E shows a method for generating a row of a Karnaugh map using the one-dimensional array of the system of FIG. 1 in accordance with an embodiment of the present disclosure.

Refer now to FIG. 3E which shows a method 350 for generating a row of a Karnaugh map using the one-dimensional array of the system of FIG. 1 in accordance with an embodiment of the present disclosure. Method 350 may be step 316 of FIG. 3B.

Method 350 includes steps 352-356. Step 352 retrieves a successive index of the one-dimensional array. Step 354 multiplies a value in the successive index by a constant to obtain an increment value. The constant is the number of rows that exists within the K-map. Step 356 sums the increment value with a previously used value of a row in the first dimension of the Karnaugh map to determine the subsequent value of the row in the first dimension. Step 358 repeats the steps of retrieving, multiplying, and summing until the first location is determined.

Figure 3F:
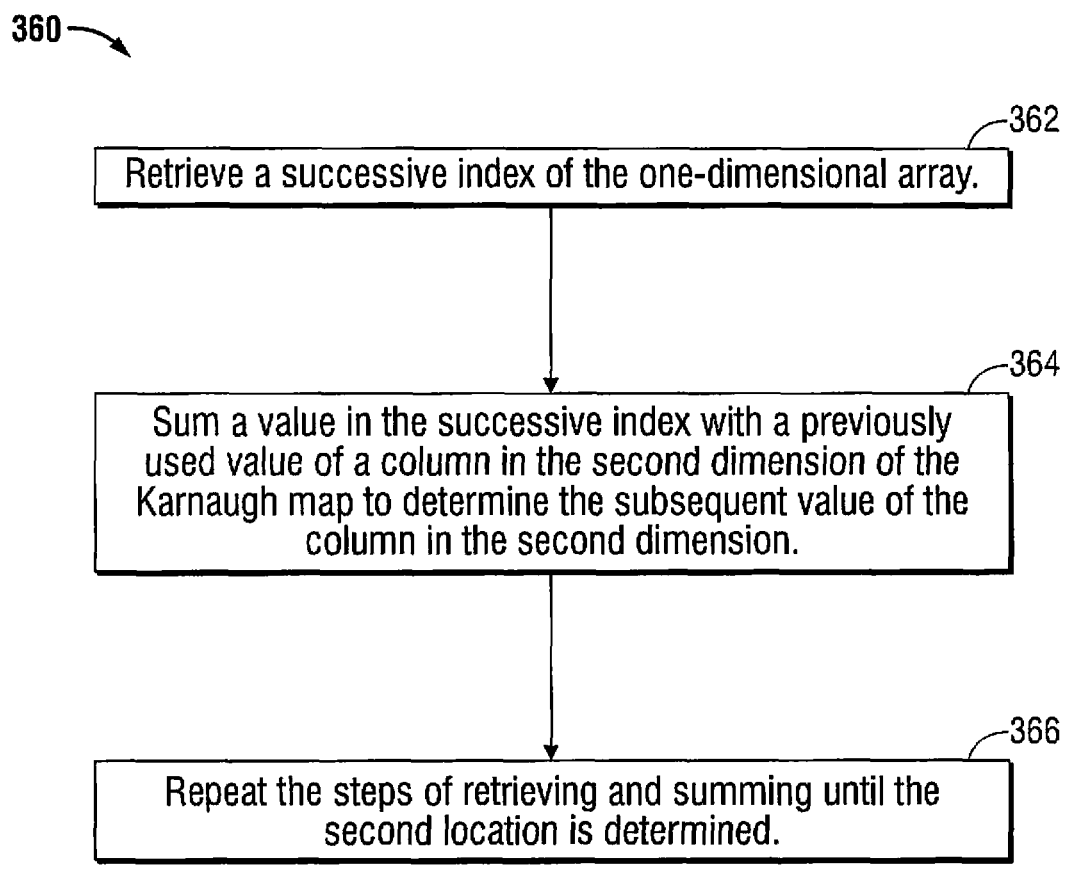
FIG. 3F shows a method for generating a column of a Karnaugh map using the one-dimensional array of the system of FIG. 1 in accordance with an embodiment of the present disclosure.

FIG. 3F shows a method 360 for generating a column of a Karnaugh map using the one-dimensional array 126 of the system of FIG. 1 in accordance with an embodiment of the present disclosure. Method 360 may be step 318 of FIG. 3B. Method 360 includes steps 362-366. Step 362 retrieves a successive index of the one-dimensional array. Step 364 sums a value in the successive index with a previously used value of a column in the second dimension of the Karnaugh map to determine the subsequent value of the column in the second dimension. Step 366 repeats the steps of retrieving and summing until the second location is determined.

Referring again to FIG. 3B-3C, step 320 adds values within the first and second locations together to obtain the target location. Step 322 evaluates the target location within the Karnaugh map corresponding to the first and second indices of the one-dimensional array in the first and second dimensions of the Karnaugh map, respectively. Step 324 searches for simplified minterms or simplified implicants having the target location using the one-dimensional array. Step 326 generates the optimized Boolean logic, e.g., the expressing having the simplified minterms and/or simplified implicants.

As shown in FIG. 3C, steps 328-340 show the various uses of the optimized Boolean logic. Step 328 generates a representation of a digital circuit corresponding to optimized Boolean logic. Step 330 develops a photomask for manufacturing the digital circuit. Step 332 designs and programs a digital circuit and/or a programmable logic device using the representation. Step 334 uses the optimized Boolean logic in a software-based electronic CAD program. Step 336 uses the optimized Boolean logic in a cryptographic engine. Step 338 generates symbolic logic using the optimized Boolean logic. Step 340 generates the optimized Boolean log diagram as part of a teaching program.

Figure 7:
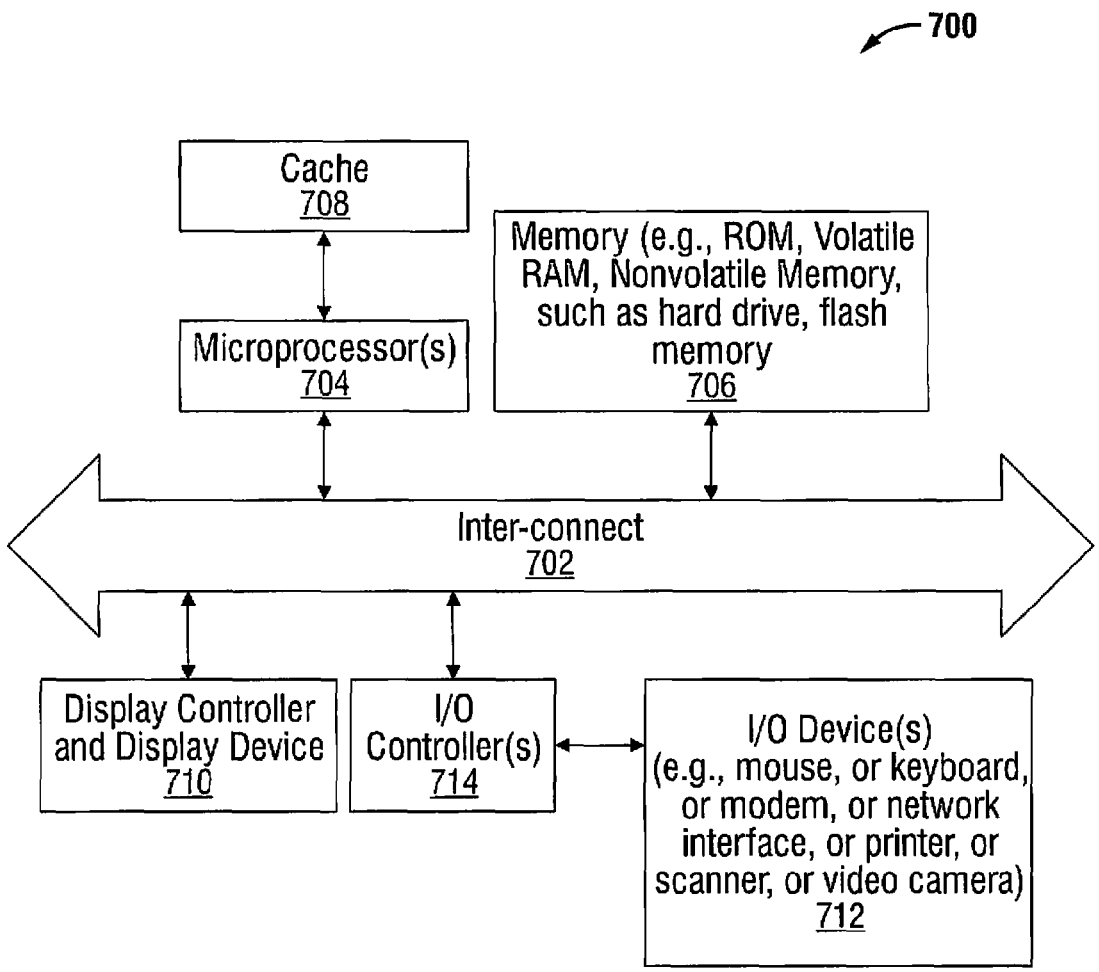
FIG. 7 shows a block diagram of a computer system that executes the programming instructions for optimizing Boolean logic as shown in the block diagram of FIG. 1 in accordance with an embodiment of the present disclosure.

FIG. 7 shows a block diagram of a computer system 700 that executes the programming instructions for optimizing Boolean logic within the computer-readable medium 102 as shown in the block diagram of FIG. 1 in accordance with an embodiment of the present disclosure. While FIG. 7 illustrates various components of a computer system 700, it is not intended to represent any particular architecture or manner of interconnecting the components. Some embodiments may use other systems that have fewer or more components than those shown in FIG. 7.

In FIG. 7, the computer system 700 includes an inter-connect 702 (e.g., bus and system core logic) that interconnects a microprocessor(s) 704 to a memory 706. The microprocessor 704 is coupled to a cache memory 708.

The inter-connect 702 interconnects the microprocessor(s) 704 and the memory 706 together and also interconnects them to a display controller, display device 710 and to peripheral devices such as input/output (I/O) devices 712 through an input/output controller(s) 714.

Typical I/O devices include mice, keyboards, modems, network interfaces, printers, scanners, video cameras and other devices which are well known in the art. In some embodiments, when the data processing system is a server system, some of the I/O devices, such as printer, scanner, mice, and/or keyboards, are optional.

The inter-connect 702 may include one or more buses connected to one another through various bridges, controllers and/or adapters. In one embodiment, the I/O controller 714 includes a USB (Universal Serial Bus) adapter for controlling USB peripherals, and/or an IEEE-1394 bus adapter for controlling IEEE-1394 peripherals.

The memory 706 may include ROM (Read Only Memory), volatile RAM (Random Access Memory), and non-volatile memory, such as hard drive, flash memory, etc.

Volatile RAM is typically implemented as dynamic RAM (DRAM), which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In this description, various functions and operations may be described as being performed by or caused by software code to simplify description. However, those skilled in the art will recognize that what is meant by such expressions is that the functions result from execution of the instructions by a processor, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable medium used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine-readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a computer-readable medium includes any apparatus that provides (i.e., stores and/or transmits) information in a form accessible by a machine (e.g., a computer, network device, personal digital assistant, manufacturing tool, any device with a set of one or more processors, etc.).

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system for optimizing Boolean logic, the system comprising:
   a processor; and
   a non-transitory, computer-readable medium in communication with the processor, wherein the non-transitory, computer-readable medium comprises one or more programming instructions for:
      generating a one-dimensional array having a plurality of values corresponding to a plurality of indices;
      determining a first location of a Karnaugh map in a first dimension thereof, wherein the first location corresponds to a first index of the one-dimensional array and to a target location of the Karnaugh map, wherein the first location is determined using a first value of the one-dimensional array corresponding to the first index of the one-dimensional array;
      determining a second location of the Karnaugh map in a second dimension thereof, wherein the second location corresponds to a second index of the one-dimensional array and to the target location of the Karnaugh map, wherein the second location is determined using a second value of the one-dimensional array corresponding to the second index of the one-dimensional array;
      evaluating the target location within the Karnaugh map corresponding to the first and second indices of the one-dimensional array in the first and second dimensions of the Karnaugh map, respectively; and
      searching for at least one of a simplified minterm and a simplified implicant having the target location using the one-dimensional array.

2. The system according to claim 1, wherein the one or more programming instructions further comprise programming instructions for:
   receiving a plurality of input values each corresponding to at least one Boolean input variable;
   receiving a plurality of output values each corresponding to at least one Boolean output variable, wherein each of the plurality of input values is mapped to a respective output value of the plurality of output values;
   determining a first subset of Boolean input variables of the at least one Boolean input variable to represent the first dimension of a Karnaugh map; and
   determining a second subset of Boolean input variables of the at least one Boolean input variable to represent the second dimension of the Karnaugh map.

3. The system according to claim 2, wherein the one or more programming instructions for determining the first and second subsets further comprise programming instructions for:
   dividing a total number of the at least one Boolean input variable by two to obtain a result;
   rounding, if necessary, the result;
   determining the first subset from the result; and
   determining the second subset from the result.

4. The system according to claim 1, wherein the one or more programming instructions further comprise programming instructions for implementing a Quine-McCluskey algorithm to remove a duplicative variable from an input function of minterms.

5. The system according to claim 1, wherein the one or more programming instructions further comprise programming instructions for adding values within the first and second locations together to obtain the target location.

6. The system according to claim 1, wherein the one or more programming instructions further comprise programming instructions for generating a representation of a digital circuit corresponding to the at least one of the simplified minterm and the simplified implicant.

7. The system according to claim 6, wherein the one or more programming instructions further comprise programming instructions for programming at least one of a digital circuit and a programmable logic device using the representation.

8. The system according to claim 6, wherein the one or more programming instructions further comprise programming instructions for developing a photomask using the representation.

9. The system according to claim 1, wherein the one or more programming instructions further comprise programming instructions for cytological techniques.

10. The system according to claim 1, wherein the one or more programming instructions further comprise programming instructions for generating symbolic logic corresponding to the at least one of the simplified minterm and the simplified implicant.

11. The system according to claim 1, wherein the one or more programming instructions is part of a software-based electronic CAD program.

12. The system according to claim 1, wherein the one or more programming instructions is part of a teaching program.

13. The system according to claim 1, wherein the one or more programming instructions for generating the one-dimensional array further comprises programming instructions for:
   generating a first array for one less than the longer of a length of the first dimension of the Karnaugh map and a length of the second dimension of the Karnaugh map;
   assign a middle index with a natural log of one more than a length of the first array;
   decrease a current power of two;
   fill any empty indices; and
   negate each even number occurrence of a give value.

14. The system according to claim 1, wherein the one or more programming instruction for determining the first location of the Karnaugh map in the first dimension thereof further comprises programming instructions for:
   retrieving a successive index of the one-dimensional array;
   multiplying a value in the successive index by a constant to obtain an increment value;

summing the increment value with a previously used value of a row in the first dimension of the Karnaugh map to determine the subsequent value of the row in the first dimension; and repeating the steps of retrieving, multiplying, and summing until the first location is determined.

15. The system according to claim 1, wherein the one or more programming instruction for determining the second location of the Karnaugh map in a second dimension thereof further comprises programming instructions for:

retrieving a successive index of the one-dimensional array;

summing a value in the successive index with a previously used value of a column in the second dimension of the Karnaugh map to determine the subsequent value of the column in the second dimension; and repeating the steps of retrieving and summing until the second location is determined.

16. A method for optimizing Boolean logic, the method comprising:

determining, by a processor, first and second subsets of Boolean variables from a plurality of input values corresponding to at least one Boolean input variable;

generating, by the processor, a one-dimensional array;

determining, by the processor, a first location in a first dimension of a Karnaugh map using the one-dimensional array;

determining, by the processor, a second location in a second dimension of the Karnaugh map using the one-dimensional array; and determining, by the processor, a value of a target location corresponding to an intersection of a first index corresponding to the first location and a second index corresponding to the second location within the Karnaugh map.

17. The method according to claim 16, wherein the generating, by the processor, of the one-dimensional array comprises:

generating a first array for one less than the longer of a length of the first dimension of the Karnaugh map and a length of the second dimension of the Karnaugh map;

assign a middle index with a natural log of one more than a length of the first array;

decrease a current power of two;

fill any empty indices; and negate each even number occurrence of a give value.

18. The method according to claim 16, wherein the determining, by the processor, the first location in the first dimension of the Karnaugh map using the one-dimensional array, comprises:

retrieving a successive index of the one-dimensional array;

multiplying a value in the successive index by a constant to obtain an increment value;

summing the increment value with a previously used value of a row in the first dimension of the Karnaugh map to determine the subsequent value of the row in the first dimension; and repeating the steps of retrieving, multiplying, and summing until the first location is determined.

19. The method according to claim 16, wherein the determining, by the processor, the second location in the second dimension of the Karnaugh map using the one-dimensional array comprises:

retrieving a successive index of the one-dimensional array;

summing a value in the successive index with a previously used value of a column in the second dimension of the Karnaugh map to determine the subsequent value of the column in the second dimension; and repeating the steps of retrieving and summing until the second location is determined.

20. The method according to claim 16, further comprising searching, by the processor, for at least one of a simplified minterm and a simplified implicant having the target location.

21. The method according to claim 20, further comprising developing a photomask corresponding to the at least one of the simplified minterm and the simplified implicant.

22. The method according to claim 20, further comprising programming at least one of a digital logic device and a programmable logic device corresponding to the at least one of the simplified minterm and the simplified implicant.

23. A computer system for optimizing Boolean logic having a processor and an operating environment, the computer system having a non-transitory, computer-readable medium in communication with the processor, the non-transitory, computer-readable medium comprising:

an array component configured to generate a one-dimensional array having a plurality of values corresponding to a plurality of indices; and an optimization component configure to:

determine a first location of a Karnaugh map in a first dimension thereof, wherein the first location corresponds to a first index of the one-dimensional array and to a target location of the Karnaugh map, wherein the first location is determined using a first value of the one-dimensional array corresponding to the first index of the one-dimensional array;

determine a second location of the Karnaugh map in a second dimension thereof, wherein the second location corresponds to a second index of the one-dimensional array and to the target location of the Karnaugh map, wherein the second location is determined using a second value of the one-dimensional array corresponding to the second index of the one-dimensional array;

evaluate the target location within the Karnaugh map corresponding to the first and second indices of the one-dimensional array in the first and second dimensions of the Karnaugh map, respectively; and search for at least one of a simplified minterm and a simplified maxterm having the target location using the one-dimensional array.

24. The computer system according to claim 23, wherein the non-transitory, computer-readable medium further comprises:

a communication component configured to:

receive a plurality of input values each corresponding to at least one Boolean input variable; and receive a plurality of output values each corresponding to at least one Boolean output variable, wherein each of the plurality of input values is mapped to a respective output value of the plurality of output values; and a map component configured to:

determine a first subset of Boolean input variables of the at least one Boolean input variable to represent the first dimension of a Karnaugh map; and determine a second subset of Boolean input variables of the at least one Boolean input variable to represent the second dimension of the Karnaugh map.

25. The computer system according to claim 24, wherein the map component generates the one-dimensional array by:

generating a first array for one less than the longer of a length of the first dimension of the Karnaugh map and a length of the second dimension of the Karnaugh map;

assign a middle index with a natural log of one more than a length of the first array;

decrease a current power of two;
fill any empty indices; and
negate each even number occurrence of a give value.

26. The computer system according to claim 23, wherein the optimization component determines the first and second locations by:
(i) retrieving a successive index of the one-dimensional array;
(ii) multiplying a value in the successive index by a constant to obtain an increment value;
(iii) summing the increment value with a previously used value of a row in the first dimension of the Karnaugh map to determine the subsequent value of the row in the first dimension;
(iv) repeating the steps of (i) retrieving, (ii) multiplying, and (iii) summing until the first location is determined;
(v) retrieving a successive index of the one-dimensional array;
(vi) summing a value in the successive index with a previously used value of a column in the second dimension of the Karnaugh map to determine the subsequent value of the column in the second dimension; and
(vii) repeating the steps of (v) retrieving and (vi) summing until the second location is determined.

* * * * *